(12) United States Patent
Murakami

(10) Patent No.: US 9,269,533 B2
(45) Date of Patent: Feb. 23, 2016

(54) ANALYSIS APPARATUS AND ANALYSIS METHOD

(71) Applicant: KABUSHIKI KAISHA TOSHIBA, Minato-ku (JP)

(72) Inventor: Takeshi Murakami, Yokkaichi (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 14/482,652

(22) Filed: Sep. 10, 2014

(65) Prior Publication Data

US 2015/0255247 A1    Sep. 10, 2015

Related U.S. Application Data

(60) Provisional application No. 61/947,756, filed on Mar. 4, 2014.

(51) Int. Cl.
*H01J 37/26* (2006.01)
*H01J 37/28* (2006.01)

(52) U.S. Cl.
CPC .............. *H01J 37/26* (2013.01); *H01J 37/28* (2013.01); *H01J 2237/2801* (2013.01)

(58) Field of Classification Search
USPC ............... 250/305, 306, 307, 309, 310, 311
See application file for complete search history.

(56) References Cited

U.S. PATENT DOCUMENTS

| 5,412,211 A | 5/1995 | Knowles |
| 2012/0025074 A1* | 2/2012 | Barbi .............. G01T 1/2018 |
| | | 250/307 |
| 2012/0273679 A1* | 11/2012 | Bewick et al. ............. 250/310 |

FOREIGN PATENT DOCUMENTS

| JP | 6-130005 | 5/1994 |
| JP | 2003-229083 | 8/2003 |
| JP | 2005-71747 | 3/2005 |

* cited by examiner

*Primary Examiner* — Nicole Ippolito
(74) *Attorney, Agent, or Firm* — Oblon, McClelland, Maier & Neustadt, L.L.P.

(57) ABSTRACT

In accordance with an embodiment, an analysis apparatus includes a secondary electron optical system, at least one detector, and a composition analysis unit. The secondary electron optical system includes a charged particle beam source and a lens. The charged particle beam source generates a charged particle beam and irradiates a sample with it. The lens controls a focal position and a trajectory of the charged particle beam using an electric field or a magnetic field. The detector detects a characteristic X-ray from the sample. The composition analysis unit analyzes a composition of a material constituting the sample from the detected characteristic X-ray. Each detector is arranged in such a manner that at least part of a detection surface thereof is placed on the same plane as an exit surface of the secondary electron optical system, or placed on the charged particle beam side of the same plane.

10 Claims, 3 Drawing Sheets

ANALYSIS APPARATUS AND ANALYSIS METHOD

CROSS REFERENCE TO RELATED APPLICATIONS

This application is based upon and claims the benefit of U.S. provisional Application No. 61/947,756, filed on Mar. 4, 2014, the entire contents of which are incorporated herein by reference.

FIELD

Embodiments described herein relate generally to an analysis apparatus and an analysis method.

BACKGROUND

When a sample is irradiated with an electron beam, a characteristic X-ray is generated from the sample besides a secondary electron. This characteristic X ray has energy intrinsic to an element of a material constituting the sample.

Therefore, there has been extensively used Energy Dispersive X-ray Spectroscopy (which will be simply referred to as "EDX" hereinafter) that analyzes a material composition of a sample by measuring energy of a detected characteristic X-ray.

In regard to an analysis apparatus that realizes EDX, with progress of miniaturization in semiconductor devices, a further resolution is demanded.

DETAILED DESCRIPTION

In accordance with an embodiment, an analysis apparatus includes a secondary electron optical system, at least one detector, and a composition analysis unit. The secondary electron optical system includes a charged particle beam source and a lens. The charged particle beam source generates a charged particle beam and irradiates a sample with the charged particle beam. The lens controls a focal position and a trajectory of the charged particle beam by using an electric field or a magnetic field. The detector detects a characteristic X-ray generated from the sample by irradiation of the charged particle beam. The composition analysis unit analyzes a composition of a material constituting the sample from the detected characteristic X-ray. Each detector is arranged in such a manner that at least part of a detection surface thereof is placed on the same plane as an exit surface from which the charged particle beam exits from the secondary electron optical system, or placed on the charged particle beam side of the same plane.

Embodiments will now be explained hereinafter with reference to the accompanying drawings. Like components are provided with like reference signs throughout the drawings and repeated descriptions thereof are appropriately omitted.

Each of the accompanying drawings is used for promoting an explanation and an understanding of the present invention, and shapes, dimensions, ratios, and others in the respective drawings may be different from counterparts in an actual apparatus. Persons skilled in the art can appropriately subject these differences to design change while considering the following description and a well-known technology.

In the following embodiment, a situation where an electron beam is used in a Scanning Electron Microscope (which will be simply referred to as "SEM" hereinafter) as an incident beam will be taken up and explained. However, the present invention is not restricted thereto, and an analysis apparatus according to the present invention can be likewise applied to a case using an ion beam, any other charged particle beam or a particle beam, as an incident beam.

(1) Embodiment 1

Figure 1:
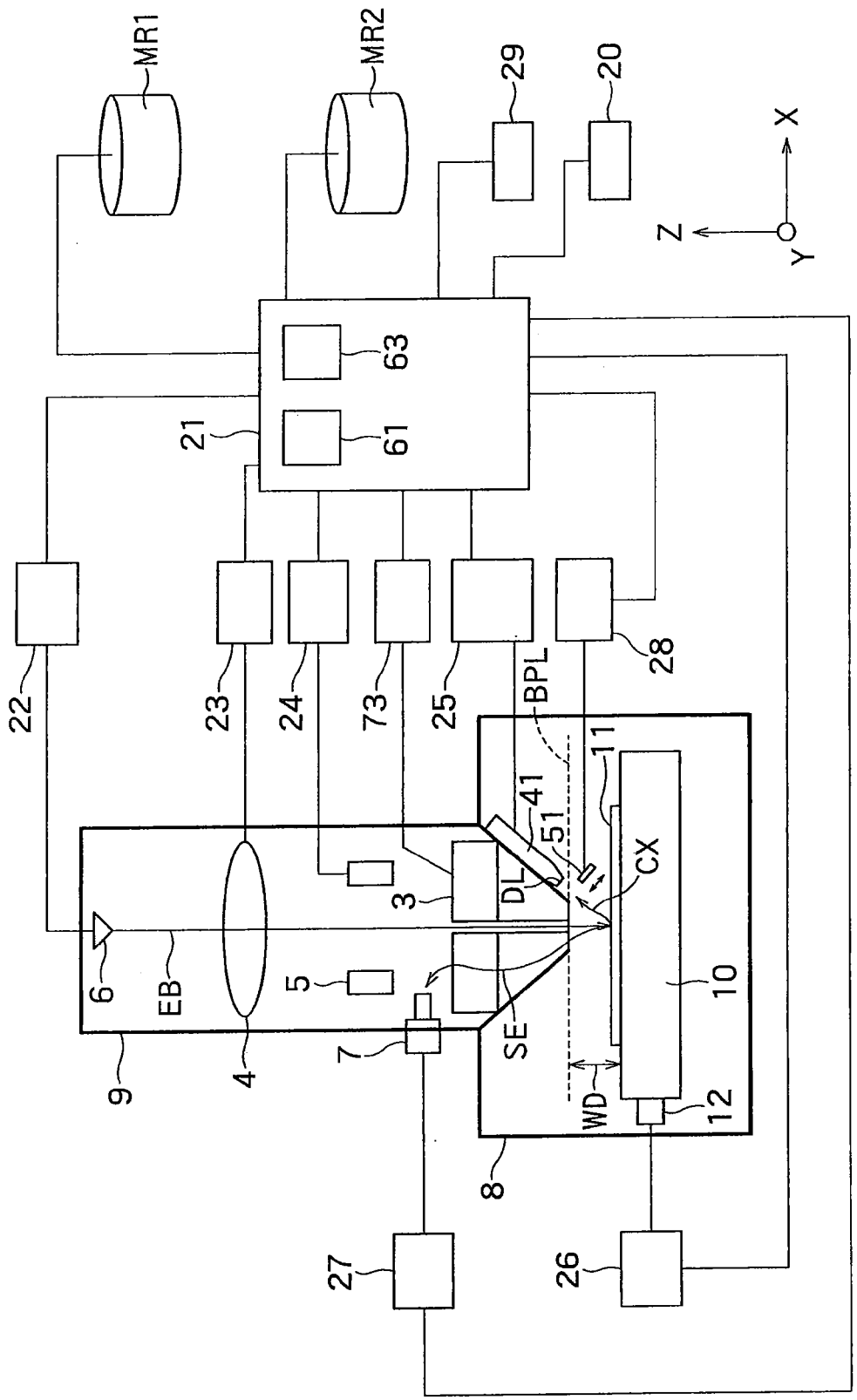
FIG. 1 is a block diagram showing an outline configuration of an analysis apparatus according to Embodiment 1.

FIG. 1 is a block diagram showing an outline configuration of an analysis apparatus according to Embodiment 1. The analysis inspection apparatus shown in FIG. 1 includes a column 9, a sample chamber 8, an electron gun control unit 22, lens control units 23 and 73, a deflector control unit 24, a signal processing unit 25, an image generation unit 27, a stage control unit 26, a control computer 21, a shutter control unit 28, memory devices MR1 and MR2, a display device 29, and an input device 20.

The control computer 21 includes a material composition analysis unit 61 and an inspection unit 63, and it is connected to the electron gun control unit 22, the lens control units 23 and 73, the deflector control unit 24, the signal processing unit 25, the image generation unit 27, the shutter control unit 28, the stage control unit 26, the memory devices MR1 and MR2, the display device 29, and the input device 20.

The column 9 accommodates a secondary electron optical system including an electron gun 6, a condenser lens 4, a deflector 5, an objective lens 3, and an electron detector 7.

In the sample chamber 8 are provided an EDX detector 41 that detects a characteristic X-ray CX, a shutter device 51, a stage 10, and an actuator 12.

The stage 10 supports a substrate 11 as a sample. The actuator 12 moves the stage 10 in three directions X, Y, and Z so that a desired inspection region can be placed in a viewing field.

The EDX detector 41 detects a specific X-ray that is generated from the substrate 11 when the substrate 11 is irradiated with an electron beam EB. On the other hand, the shutter device 51 blocks the specific X-ray and prevents the specific X-ray from entering a detection surface DL of the EDX detector 41 when detection is not carried out. The EDX detector 41 and the shutter device 51 will be described later in detail.

The electron gun control unit 22 is connected to the electron gun 6 in the column 9, the lens control unit 23 is connected to the condenser lens 4, and the lens control unit 73 is connected to the objective lens 3. The deflector control unit 24 is connected to the deflector 5, and the signal processing unit 25 is connected to the EDX detector 41. The stage control unit 26 is connected to the actuator 12 in the sample chamber 8.

The electron gun control unit 22 generates a control signal in accordance with an instruction of the control computer 21, and the electron gun 6 generates and emits an electron beam EB in response to this control signal. The emitted electron beam EB is condensed by a magnetic field or a magnetic field each generated by the condenser lens 4, then its focal position is adjusted by a magnetic field or a magnetic field each generated by the objective lens 3, and the electron beam EB strikes upon the substrate 11.

The lens control unit 23 generates a control signal in accordance with an instruction of the control computer 21, and the condenser lens 4 condenses the electron beam EB in response to this control signal.

The lens control unit 73 generates a control signal in accordance with an instruction of the control computer 21. The objective lens 3 then adjusts a focal position of the electron beam EB in response to this control signal and allows the electron beam EB to strike upon the substrate 11 in a just focused state.

The deflector control unit 24 generates a control signal in accordance with an instruction of the control computer 21. The deflector 5 then forms a deflected electric field or a deflected magnetic field based on the control signal supplied from the deflector control unit 24 and appropriately deflects the electron beam EB in an X direction and a Y direction, thereby scanning a surface of the substrate 11.

In this embodiment, the condenser lens 4, the objective lens 3, and the deflector 5 correspond to, e.g., lenses.

The shutter control unit 28 generates a control signal in accordance with an instruction of the control computer 21, drives the shutter device 51 in response to this control signal, and opens/closes a shutter as will be described later.

The memory device MR1 stores a design database concerning a pattern in an inspection region. The memory device MR2 stores a recipe file in which a procedure of material composition analysis is written, and the control computer 21 reads this recipe file and executes composition analysis of a material constituting the substrate 11.

The input device 20 is an interface used for inputting information such as a coordinate position of an inspection region, inspection conditions, various threshold values for composition analysis, and others to the control computer 21.

The control computer 21 generates various kinds of control signals besides the control signal for the deflector control unit 24 and supplies them to the electron gun control unit 22, the lens control units 23 and 73, and the stage control unit 26. As a result, beam scanning relative to a desired inspection region on the substrate 11 is carried out in accordance with the desired scanning procedure.

Secondary electrons, reflection electrons, and backscattered electrons (which will be referred to as "secondary electrons and others" hereinafter) SE are generated from the substrate 11 by the scanning using the electron beam EB relative to the inspection region and detected by the secondary electron detector 7, and a detection signal is supplied to the image generation unit 27. The image generation unit 27 processes the detection signal from the secondary electron detector 7 and generates an SEM image of the inspection region. The generated SEM image is displayed in the display device 29 through the control computer 21 and also stored in the memory device MR.

The inspection unit 63 takes out the SEM image of the inspection region from the memory device MR2 through the control computer 21, takes out design data from the memory device MR1, and executes shape measurement, defect inspection, and others of a pattern in the inspection region based on die-to-die inspection or die-to-database inspection.

The actuator 12 moves the stage 10 in accordance with a control signal generated by the stage control unit 26 based on an instruction from the control computer 21.

The EDX detector 41 is arranged to be integral with the column 9 in this embodiment. The EDX detector 41 is also arranged in such a manner that its detection surface DL is placed on the electron gun 6 side away from a bottom surface BPL of the column 9. Based on such arrangement, in this embodiment, there is no constituent element that is interposed between the column 9 and the substrate 11 during inspection analysis. As a result, the column 9 can be moved closer to the substrate 11, and a distance WD (Working Distance) between the bottom surface BPL of the column 9 and the substrate 11 can be shortened.

For example, when the EDX detector 41 is arranged between the column 9 and the substrate 11, a space corresponding to a size of the EDX detector 41 in a Z direction and a design margin is required, and hence the distance WD between the bottom surface BPL and the substrate 11 is thereby increased.

On the other hand, according to the analysis apparatus of this embodiment, the EDX detector 41 is arranged in such a manner that the detection surface DL of the EDX detector 41 is placed on the electron gun 6 side away from the bottom surface BPL of the column 9. Thus, the distance WD between the bottom surface BPL of the column 9 and the substrate 11 is shortened to, e.g., 10 mm or less. As a result, more characteristic X-rays CX can be detected, and a resolution of the material composition analysis can be improved.

The shutter device 51 is provided immediately below the detection surface DL of the EDX detector 41 and opens/closes the shutter in accordance with a control signal supplied from the shutter control unit 28. As a result, the characteristic X-ray CX can be detected by opening the shutter only at the time of detection of the characteristic X-ray CX and, on the other hand, deterioration of detection sensitivity of the EDX detector 41 is avoided by closing the shutter at timing other than detection of the characteristic X-ray CX.

The shutter can be formed by using a metal made of a material that can block the characteristic X-ray CX, e.g., a lead plate or a tungsten plate. An opening/closing function can be constituted by using, e.g., an MEMS (Micro Electro Mechanical Systems) including an actuator, a piezoelectric element, and others.

An operation of the analysis apparatus shown in FIG. 1 is as follows.

First, the column 9 and the sample chamber 8 are subjected to vacuum drawing with the use of a non-illustrated vacuum pump. The control computer 21 then reads out a recipe file from the memory device MR2 and sets an inspection region and other various inspection parameters while making reference to a layout of the inspection region from the memory device MR1.

Subsequently, the control computer 21 drives the shutter device 51 via the shutter control unit 28, thereby opening the shutter.

Then, the control computer 21 controls the electron gun 6 through the electron gun control unit 22 and irradiates the substrate 11 with the electron beam EB. The electron beam EB is subjected to beam flux adjustment by the condenser lens 4 that receives the control signal from the lens control unit 23. The electron beam EB is also subjected to focal position adjustment by the objective lens 3 that receives the control signal from the lens control unit 73, and strikes upon the surface of the substrate 11 in the just focused state.

The deflector 5 scans a desired inspection region by using the electron beam EB in response to the control signal from the deflector control unit 24. As a result, the secondary electron and others SE are discharged from the surface of the substrate 11 and detected by the secondary electron detector 7. The detection signal is supplied to the image generation unit 27, and the image generation unit 27 generates an SEM image of the inspection region. The generated SEM image is supplied from the image generation unit 27 to the control computer 21 and inspected by the inspection unit 63.

Besides the secondary electron and others SE, the characteristic X-ray CX is discharged from the substrate 11 and detected by the EDX detector 41. The detection signal provided by the EDX detector 41 is supplied to and analyzed by the material composition analysis unit 61 in the control computer 21, whereby a material composition in the inspection region of the substrate 11 is specified. In this embodiment, the material composition analysis unit 61 corresponds to, e.g., a composition analysis unit.

When the shape/defect inspection and the composition analysis are completed with respect to all inspection regions, the shutter device 51 drives the shutter to close under control of the control computer 21 via the shutter control unit 28. As a result, the EDX detector 41 is protected.

In the embodiment shown in FIG. 1, the EDX detector 41 arranged to be integral with the column 9 has been taken up and described, but the present invention is not restricted thereto. The EDX detector 41 may be arranged away from the column 9. This point can be likewise applied to the following Embodiment 2.

Figure 2:
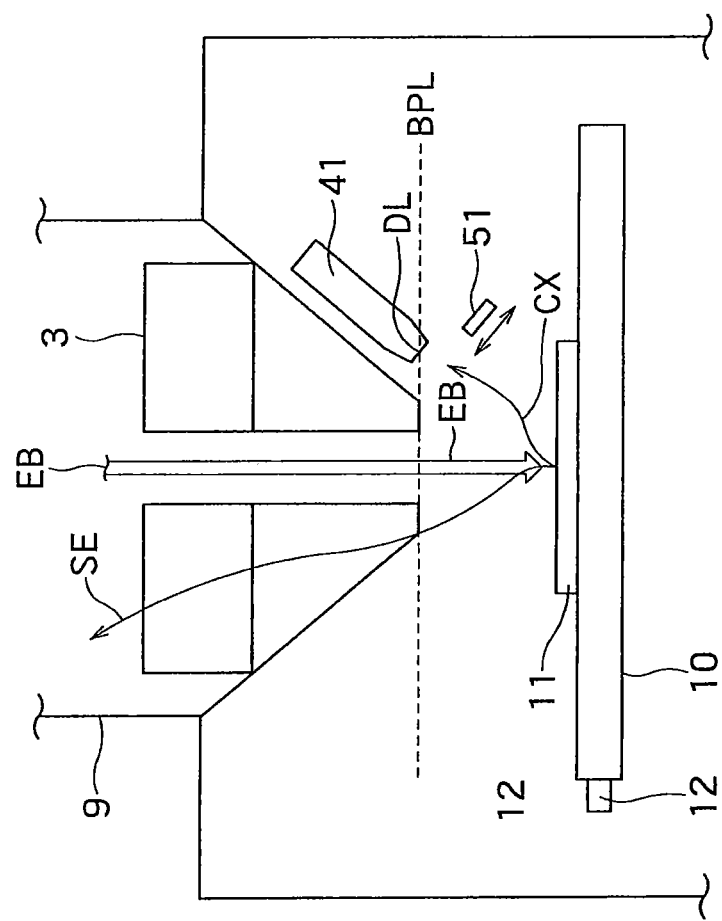
FIG. 2 is a view showing a primary part of a modification of the analysis apparatus depicted in FIG. 1.

Further, in this embodiment, the description has been given as to the case where the EDX detector 41 is arranged in such a manner that the detection surface DL of the EDX detector 41 is placed on the electron gun 6 side away from the bottom surface BPL of the column 9. However, an arrangement mode of the EDX detector 41 is not restricted to the above mode. For example, as represented by a modification in FIG. 2, the EDX detector 41 may be arranged in such a manner that part of the detection surface DL of the EDX detector 41 is placed on the sample side away from the bottom surface BPL of the column BPL. That is, except for a mode that the whole detection surface DL of the EDX detector is placed on the sample side away from the bottom surface BPL of the column 9, an effect of shortening the distance WD between the bottom surface BPL of the column 9 and the substrate 11 can be provided. This point can be likewise applied to the following Embodiment 2.

(2) Embodiment 2

Figure 3:
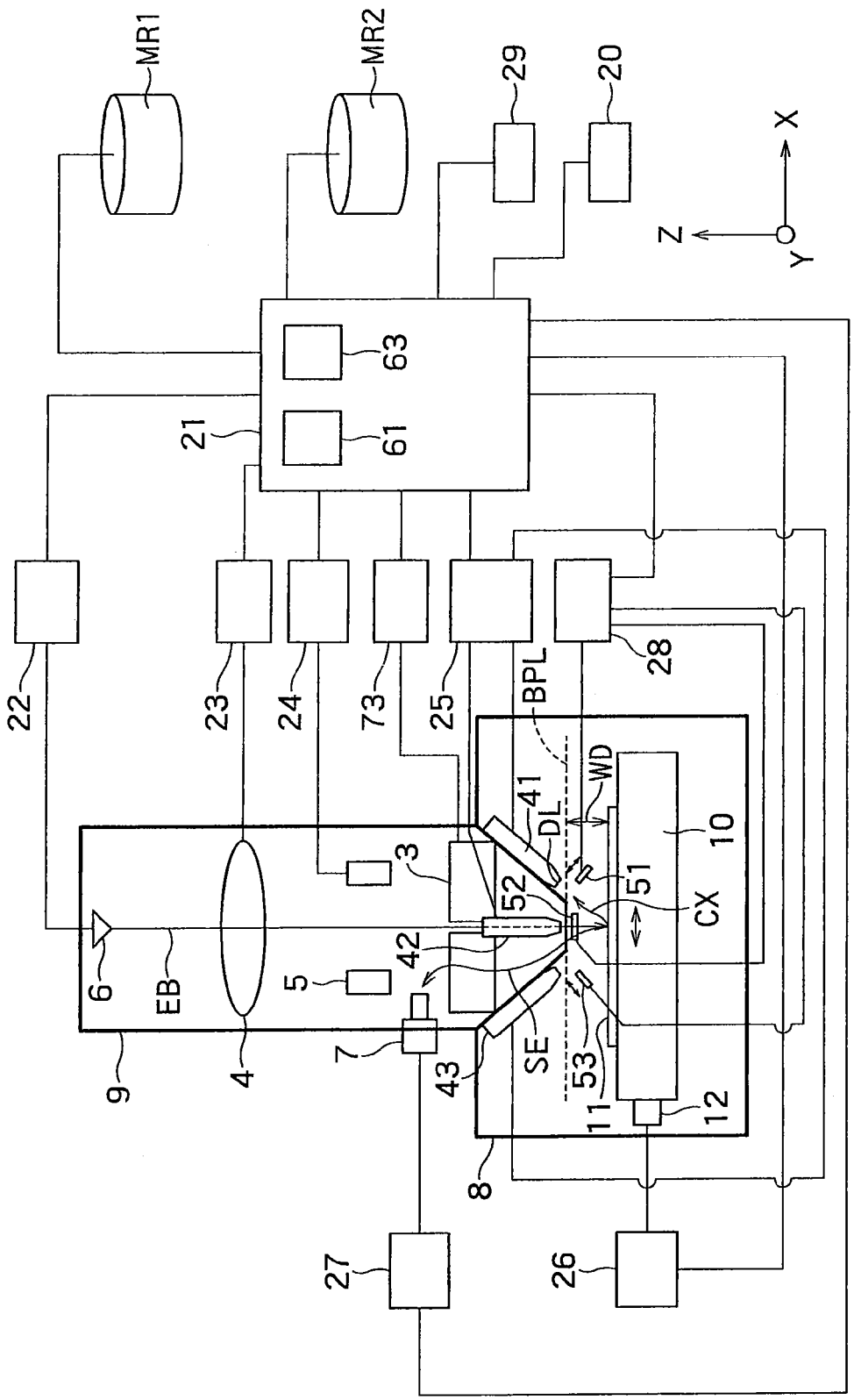
FIG. 3 is a block diagram showing an outline configuration of an analysis apparatus according to Embodiment 2.

FIG. 3 is a block diagram showing an outline configuration of an analysis apparatus according to Embodiment 2. As obvious from a comparison with FIG. 1, the analysis apparatus according to this embodiment includes a plurality of EDX detectors which are formed to be integral with a column 9 or arranged in proximity to the same. In an example shown in FIG. 3, three detectors, i.e., EDX detectors 41 to 43 are provided.

Likewise, shutter devices 51 to 53 are arranged immediately below the EDX detectors 42 to 43 so as to correspond the EDX detectors 41 to 43, respectively.

With such a configuration, according to the analysis apparatus of this embodiment, since a large quantity of characteristic X-rays CX can be detected without increasing the number of times of irradiation of an electron beam EB, composition analysis can be conducted with a higher accuracy.

To avoid charge of a substrate 11 due to long-time irradiation of the electron beam EB, an acceleration voltage of the electron beam EB may be lowered to, e.g., 2 kV or less. In an electron beam device using such a low acceleration voltage, an amount of detection of the characteristic X-rays CX may be insufficient. According to the analysis apparatus of this embodiment, even at the time of irradiation of the electron beam EB using such a low acceleration voltage, a high resolution can be maintained without deteriorating S/N.

Structures in the analysis apparatus according to this embodiment excluding the EDX detectors 42 and 43 and the shutter devices 52 and 53 are substantially the same as those in the analysis apparatus depicted in FIG. 1, thereby omitting a detailed description thereof.

In Embodiments 1 and 2 described above, the mode that the EDX detector is disposed to a SEM that detects secondary electrons and others generated from a sample by irradiation of the electron beam has been taken up and described. However, the present invention is not restricted thereto, and it can be applied to a Transparent Electron Microscope (TEM) in completely the same manner.

Furthermore, in the foregoing embodiment, the apparatus in which the column 9 is separated from the sample chamber 8 has been taken up and explained, but the present invention is not restricted thereto. When the sample chamber is provided in the column, the EDX detector may be arranged so as to be placed on the same plane as an exit surface from which the electron beam EB of the secondary electron optical system exits or on the electron gun 6 side away from the same plane. The exit surface serves as a bottom surface of a magnetic field lens or an electron lens which is the closest to the substrate 11, and it serves as the bottom surface of the objective lens in most cases.

Moreover, in the foregoing embodiment, the analysis apparatus including the shutter devices 51 (to 53) has been taken up, they are not an essential requirement. The shutter devices do not have to be provided depending on use conditions such as an acceleration voltage of the electron beam or a frequency of EDX analysis.

For example, when the electron beam with a low acceleration voltage is used, the shutter devices do not have to be provided in particular in some situations. In such a case, since there is no constitute element interposed between the detection surface DL of the EDX detector 41 and the substrate 11, the distance WD between the bottom surface BPL of the column 9 and the substrate 11 can be shortened to, e.g., 2 mm or less.

According to the analysis apparatus of at least one embodiment described above, the analysis apparatus includes at least one EDX detector arranged in such a manner that at least part of the detection surface DL of the EDX detector 41 is placed on the same plane as the bottom surface BPL of the column 9 or placed on the electron gun 6 side away from the bottom surface BPL. Consequently, a small amount of a material composition (e.g., $1 \times 10^{19}$ atoms/cc or more) of the sample can be analyzed in a small inspection region of, e.g., several-ten-micron order with a high resolution and a high accuracy.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An analysis apparatus comprising:
 a column configured to accommodate a secondary electron optical system comprising a charged particle beam source and a lens, the charged particle beam source being configured to generate a charged particle beam and irradiate a sample with the charged particle beam, the lens being configured to control a focal position and a trajectory of the charged particle beam by using an electric field or a magnetic field;

at least one detector arranged outside the column and in direct contact with the column, the detector being configured to detect a characteristic X-ray generated from the sample by irradiation of the charged particle beam; and a composition analysis unit configured to analyze a composition of a material constituting the sample from the detected characteristic X-ray, wherein each detector is arranged in such a manner that at least part of its detection surface is placed on the same plane as an exit surface from which the charged particle beam exits from the secondary electron optical system, or placed on the charged particle beam source side away from the same plane.

2. The analysis apparatus of claim 1, wherein the column comprises a tapered end portion facing the sample, and the detector is arranged in contact direct with the tapered end portion of the column.

3. The analysis apparatus of claim 1, further comprising:

a shutter device which is arranged between the detection surface of the detector and the sample and configured to block incidence of the characteristic X-ray to the detection surface.

4. The analysis apparatus of claim 1, further comprising a plurality of the detectors.

5. The analysis apparatus of claim 1, wherein a distance between the exit surface of the charged particle beam and the sample is 2 mm or less.

6. The analysis apparatus of claim 1, wherein the exit surface from which the charged particle beam exits from the secondary electron optical system is a bottom surface of an objective lens configured to control a focal position of the charged particle beam.

7. The analysis apparatus of claim 1, wherein a distance between the detection surface of the detector and the sample is 10 mm or less.

8. An analysis method comprising:

generating a charged particle beam and irradiate a sample with the charged particle beam by a charged particle beam source in a column comprising an exit surface from which the charged particle beam exits toward the sample;

controlling a focal position and a trajectory of the charged particle beam by a secondary electron optical system in the column, the secondary electron optical system comprising a lens generating an electric field or a magnetic field;

detecting a characteristic X-ray generated from the sample due to irradiation of the charged particle beam by a detector arranged outside the column and in direct contact with the column; and analyzing a composition of a material constituting the sample from the detected characteristic X-ray, wherein the characteristic X-ray is detected at a position in the same plane as the exit surface of the column, or a position away from the exit surface on the charged particle beam source side.

9. The analysis method of claim 8, wherein a distance between the exit surface of the charged particle beam and the sample is 2 mm or less.

10. The analysis method of claim 8, wherein a distance between a surface of the sample and the position at which the characteristic X-ray is detected is 10 mm or less.

* * * * *